US012593601B2

(12) United States Patent
Ni

(10) Patent No.: US 12,593,601 B2
(45) Date of Patent: Mar. 31, 2026

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Jing Ni, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 478 days.

(21) Appl. No.: 18/029,459

(22) PCT Filed: Mar. 23, 2023

(86) PCT No.: PCT/CN2023/083486
§ 371 (c)(1),
(2) Date: Mar. 30, 2023

(87) PCT Pub. No.: WO2024/016704
PCT Pub. Date: Jan. 25, 2024

(65) Prior Publication Data
US 2024/0324412 A1 Sep. 26, 2024

(30) Foreign Application Priority Data
Jul. 18, 2022 (CN) .......................... 202210843362.1

(51) Int. Cl.
*H10K 59/80* (2023.01)
*H04M 1/02* (2006.01)
*H10K 102/00* (2023.01)

(52) U.S. Cl.
CPC ...... *H10K 59/8731* (2023.02); *H04M 1/0268* (2013.01); *H10K 2102/311* (2023.02)

(58) Field of Classification Search
None
See application file for complete search history.

(56) References Cited

U.S. PATENT DOCUMENTS

2016/0365398 A1* 12/2016 Kim ..................... H10K 59/131
2017/0331073 A1 11/2017 Choi et al.
(Continued)

FOREIGN PATENT DOCUMENTS

CN 103824871 A 5/2014
CN 104332483 A 2/2015
(Continued)

OTHER PUBLICATIONS

PCT International Search Report for International Application No. PCT/CN2023/083486, mailed on May 23, 2023, 9pp.
(Continued)

*Primary Examiner* — Kyoung Lee
(74) *Attorney, Agent, or Firm* — The Roy Gross Law Firm, LLC; Roy D. Gross

(57) ABSTRACT

The present disclosure discloses a display panel and a mobile terminal. The display panel includes a substrate, at least one first inorganic layer, a light-emitting layer, an encapsulation layer, an organic functional layer, and a second inorganic layer that are stacked in sequence. The organic functional layer is disposed between a border of the encapsulation layer and a border of the first inorganic layer in a non-display area. The second inorganic layer extends from the display area to the non-display area, covers at least part of the organic functional layer, and is in contact with at least part surface of the first inorganic layer located at a border of the organic functional layer and a border of the substrate.

20 Claims, 6 Drawing Sheets

(56) References Cited

U.S. PATENT DOCUMENTS

| 2018/0164933 A1* | 6/2018 | Jun | .................. H10K 59/40 |
| 2020/0135835 A1 | 4/2020 | Seo et al. | |

FOREIGN PATENT DOCUMENTS

| CN | 104377225 | A | 2/2015 |
| CN | 108649133 | A | 10/2018 |
| CN | 109728190 | A | 5/2019 |
| CN | 109950421 | A | 6/2019 |
| CN | 110211998 | A | 9/2019 |
| CN | 110400891 | A | 11/2019 |
| CN | 111129347 | A | 5/2020 |
| CN | 111129349 | A | 5/2020 |
| CN | 111162097 | A | 5/2020 |
| CN | 111430442 | A | 7/2020 |
| CN | 112799550 | A | 5/2021 |
| CN | 115275044 | A | 11/2022 |

OTHER PUBLICATIONS

PCT Written Opinion of the International Searching Authority in International application No. PCT/CN2023/083486, mailed on May 23, 2023, 8pp.

Chinese Office Action issued in corresponding Chinese Patent Application No. 202111464063.9 dated May 29, 2023, pp. 1-8, 11pp.

Chinese Notice of Allowance issued in corresponding Chinese Patent Application No. 202111464063.9 dated Jun. 28, 2023, pp. 1-4, 10pp.

* cited by examiner

100

200

300

A - - - - - - - - A

121

121a

DISPLAY PANEL AND MOBILE TERMINAL

CROSS REFERENCE TO RELATED APPLICATIONS

This application is a National Phase of PCT Patent Application No. PCT/CN2023/083486 having International filing date of Mar. 23, 2023, which claims the benefit of priority of Chinese Patent Application No. 202210843362.1, filed Jul. 18, 2022, the contents of which are all incorporated herein by reference in their entirety.

TECHNICAL FIELD

The present disclosure relates to a technical field of display, and in particular, to a display panel and a mobile terminal.

BACKGROUND

Currently, a touch layer of a flexible organic light-emitting diode (OLED) of a display panel is generally disposed on a thin film encapsulation layer, and an inorganic layer in the touch layer extends from a display area to a border of the display panel, and is in contact with a surface of an organic layer at the border.

For an existing four-curved display panel, since one side of the display panel needs to be bent, and the adhesion between an inorganic layer in the touch layer and an organic layer at the border is weak, the inorganic layer in the touch layer is easy to peel off from an underlying organic film layer in the border area of the display panel.

Therefore, there is an urgent need for a display panel to solve the above technical problem.

Technical Problem

The present disclosure provides a display panel and a mobile terminal to solve the technical problem that the inorganic film layer at the border of a current display panel is peeled off.

Technical Solutions

Examples of the present disclosure provide display panels and mobile terminals, which include a display area and at least one non-display area located on one side of the display area, wherein the display panel further includes:

a substrate;

at least one first inorganic layer disposed on one side of the substrate;

a light-emitting layer disposed at one side of the first inorganic layer away from the substrate, wherein the light-emitting layer includes a plurality of light-emitting pixels disposed in the display area;

an encapsulation layer disposed on one side of the light-emitting layer away from the substrate, wherein the encapsulation layer extends from the display area to the non-display area;

an organic functional layer disposed on one side of the first inorganic layer away from the substrate and disposed in the non-display area; and a second inorganic layer disposed on one side of the encapsulation layer away from the substrate, wherein the second inorganic layer extends from the display area to the non-display area, covers at least part of the organic functional layer, and is in contact with at least part surface of the first inorganic layer located at a border of the organic functional layer and a border of the substrate.

Examples of the present disclosure provide another display panel including a display area and at least one non-display area located on one side of the display area, wherein the display panel further includes:

a substrate;

at least one first inorganic layer disposed on one side of the substrate, wherein a spacing exists between a border of the first inorganic layer and a border of the substrate;

a light-emitting layer disposed on one side of the first inorganic layer away from the substrate, wherein the light-emitting layer comprises a plurality of light-emitting pixels disposed in the display area;

an encapsulation layer disposed on one side of the light-emitting layer away from the substrate, wherein the encapsulation layer extends from the display area to the non-display area; and a second inorganic layer disposed on one side of the encapsulation layer away from the substrate, wherein the second inorganic layer extends from the display area to the non-display area, and is in contact with at least part surface of the first inorganic layer located at a border of the organic functional layer and a border of the substrate.

TECHNICAL EFFECTS

In the present disclosure, a border of the second inorganic layer extends toward a border of the display panel to cover at least part of the organic functional layer, so that the second inorganic layer is in contact with at least part surface of the first inorganic layer located at a border of the organic functional layer and a border of the substrate, which increases the adhesion between the second inorganic layer and the first inorganic layer, thus eliminating the risk of peeling off the second inorganic layer due to bending of the border.

DETAILED DESCRIPTION

Figure 1:
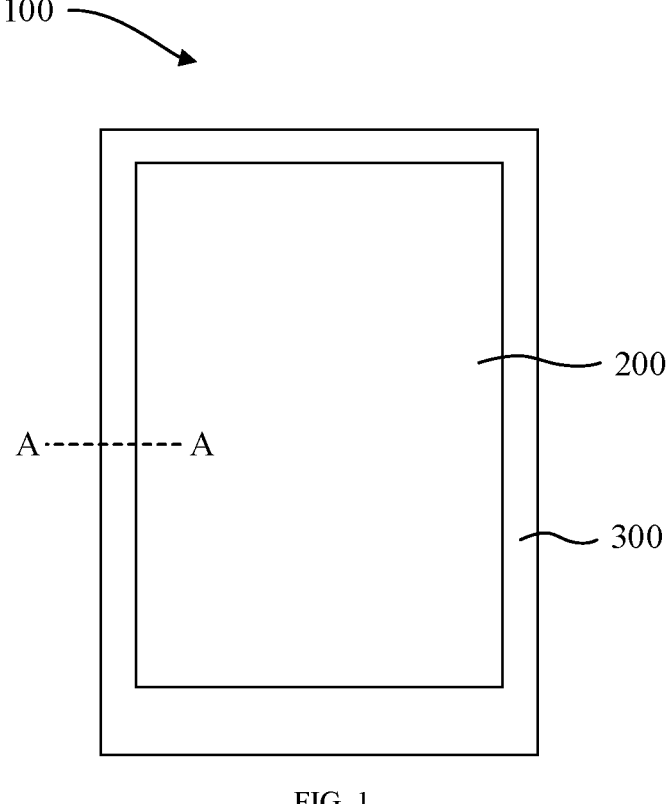
FIG. 1 is a schematic structural diagram of a display panel according to the present disclosure.

In order to make the purpose, technical solutions, and effects of the present disclosure more clear and definite, the present disclosure is further described in detail below with reference to the accompanying drawings and examples. It should be understood that the specific examples described herein are only used to explain the present disclosure, and are not used to limit the present disclosure.

With reference to FIGS. 1 to 6, the present disclosure provides a display panel 100, which includes a display area 200 and at least one non-display area 300 located on one side of the display area 200. The display area 200 includes a bending sub-area 400 disposed close to the non-display area 300. The display panel 100 further includes:

a substrate 101;

a first inorganic layer 120 disposed on one side of the substrate 101;

a light-emitting layer 302 disposed on one side of the first inorganic layer 120 away from the substrate 101, and the light-emitting layer 302 includes a plurality of light-emitting pixels disposed in the display area 200;

an encapsulation layer 40 disposed on one side of the light-emitting layer 302 away from the substrate 101, and the encapsulation layer 40 extends from the display area 200 to the non-display area 300; and an organic functional layer 70 disposed on one side of the first inorganic layer 120 away from the substrate 101 and disposed between a border of the encapsulation layer 40 and a border of the first inorganic layer 120 in the non-display area 300; and a second inorganic layer 520 disposed on one side of the encapsulation layer 40 away from the substrate 101, and the second inorganic layer 520 extends from the display area 200 to the non-display area 300, covers at least part of the organic functional layer 70 and is in contact with at least part surface of the first inorganic layer located at a border of the organic functional layer and a border of the substrate.

In the present disclosure, the second inorganic layer 520 extends towards a border of the display panel 100 to cover at least part of the organic functional layer 70, so that the second inorganic layer 520 is in contact with at least part surface of the first inorganic layer 120 located at a border of the organic functional layer 70 and a border of the substrate 101, which increases the adhesion between the second inorganic layer 520 and the first inorganic layer 120, thus eliminating the risk of peeling off the second inorganic layer 520 due to bending of the border.

In an existing four-curved display panel, an inorganic film layer with high stress needs to be used as the inorganic layer in a touch layer to be contacted with film layers at the border due to complicated terrain in border area of the panel. However, in the border area of a display panel, the inorganic film layer with high stress may be peeled off due to stress concentration and an underlying organic layer.

In this example, internal stress of a film layer of the second inorganic layer 520 may be greater than that of the first inorganic layer 120.

It should be noted that the internal stress of a film layer the second inorganic layer 520 may be greater than or equal to −400 MPa and less than or equal to −80 MPa, which is an inherent property of a film layer of the second inorganic layer 520.

It should be noted that the second inorganic layer 520 may be any inorganic film layer above the encapsulation layer 40. In the following examples, the inorganic insulating film layer in the touch layer 50 is used as the second inorganic layer 520.

It should be noted that the non-display area 300 may be a side frame or a bottom frame of the display panel 100. In the following examples, the side frame is used as the non-display area 300 for illustration.

Technical solutions of the present disclosure are described in combination with specific examples.

Figure 2:
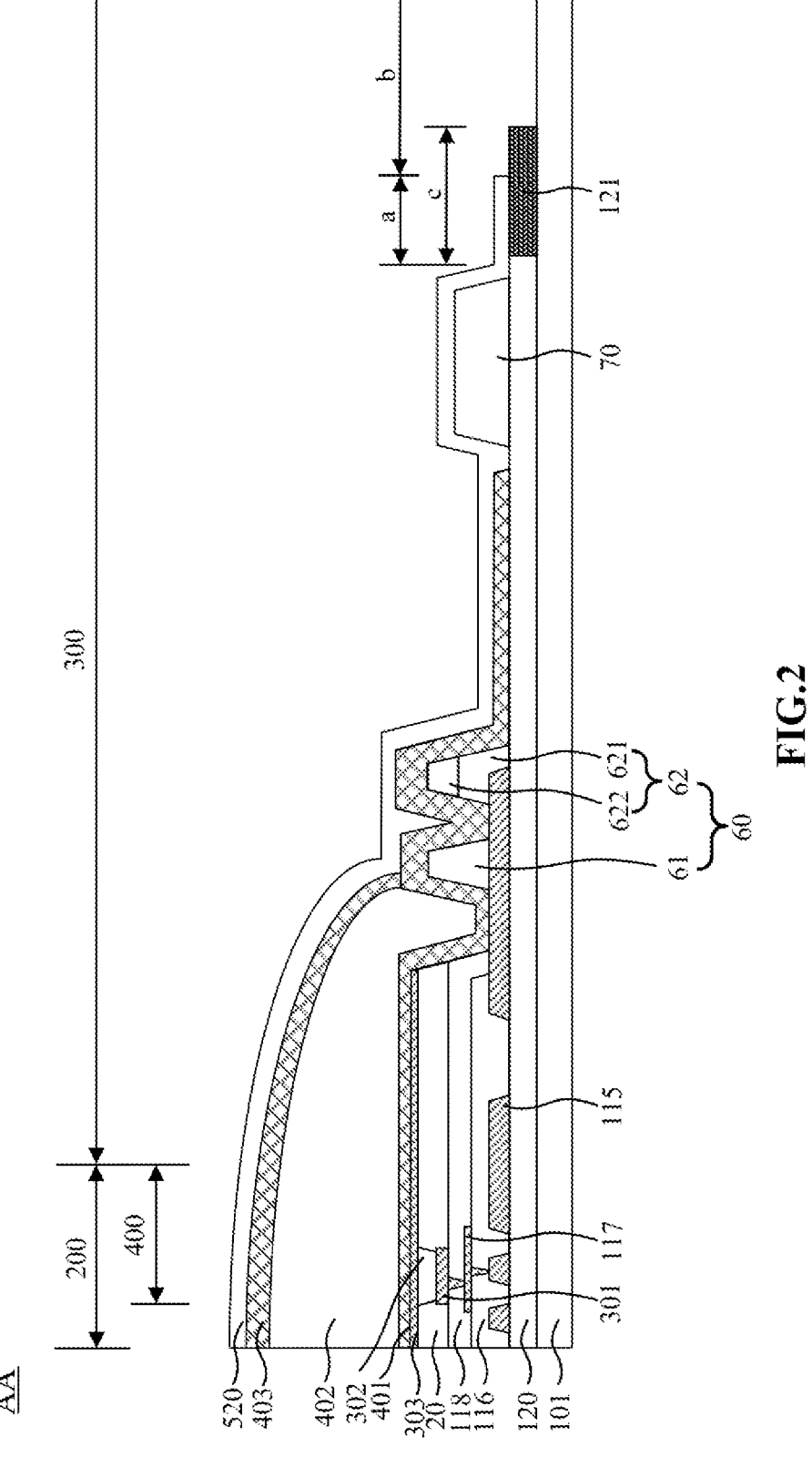
FIG. 2 is a first cross-sectional schematic view of section AA in FIG. 1.
Figure 3:
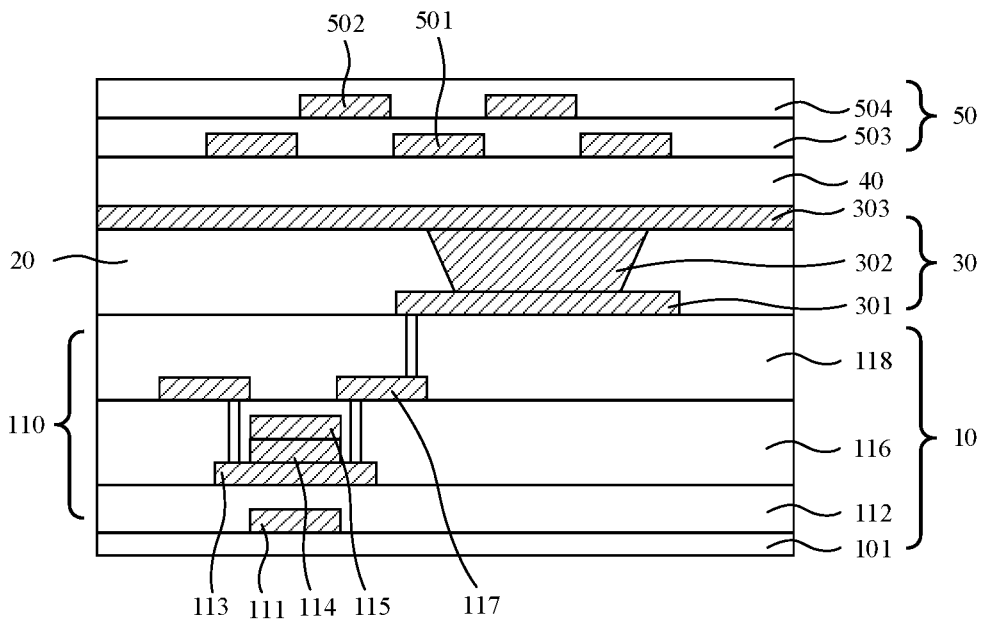
FIG. 3 is a schematic structural diagram of stacked film layers in the display area of FIG. 2.

With reference to FIGS. 2 and 3, a display panel 100 may include an array layer 10, a pixel definition layer 20 disposed on the array layer 10, a light-emitting functional layer 30 and an encapsulation layer 40 disposed on the pixel definition layer 20, and a touch layer 50 disposed on the encapsulation layer 40.

In this example, the array layer 10 may include a substrate 101 and a thin film transistor layer 110 disposed on the substrate 101, wherein the thin film transistor layer 110 may include a plurality of first inorganic layers 120 and a plurality of metal layers.

In this example, a material of the substrate 101 may be glass, quartz, polyimide, or the like. Since the display panel 100 in the present disclosure is flexible, the substrate 101 may be prepared from a flexible material such as polyimide, or a laminated film layer of a flexible material and an inorganic material.

In this example, with reference to FIG. 3, the thin film transistor layer 110 may include a plurality of thin film transistors, which may be a structure of an etch barrier type or a back channel etch type, or a structure of a bottom gate thin film transistor or a top gate thin film transistor according to positions of the gate and the active layer, which is not specifically limited. For example, the thin film transistor shown in FIG. 3 is a top gate thin film transistor type, which may include a light shielding layer 111 disposed on the substrate 101, a buffer layer 112 disposed on the light shielding layer 111, an active layer 113 disposed on the buffer layer 112, a gate insulating layer 114 disposed on the active layer 113, a gate layer 115 disposed on the gate insulating layer 114, an intermediate insulating layer 116 disposed on the gate layer 115, a source-drain layer 117 disposed on the intermediate insulating layer 116, and a planarization layer 118 disposed on the source-drain layer 117.

In this example, the plurality of first inorganic layers 120 may be gate insulating layers and intermediate insulating layers.

In this example, with reference to FIG. 3, the light-emitting functional layer 30 may include an anode layer 301 disposed on the planarization layer 118, a light-emitting layer 302 disposed on the anode layer 301, and a cathode layer 303 disposed on the light-emitting layer 302. The anode layer 301 includes a plurality of anodes. The pixel definition layer 20 includes a plurality of pixel openings in one-to-one correspondence with the plurality of anodes, and each pixel opening correspondingly exposes an upper surface of an anode. The light-emitting layer 302 may include a plurality of light-emitting pixels in one-to-one correspondence with the plurality of anodes.

In this example, with reference to FIGS. 2 and 3, the encapsulation layer 40 covers the pixel definition layer 20 and continuously covers a plurality of pixel openings and a plurality of light-emitting pixels. The encapsulation layer 40 includes a first inorganic encapsulation layer 401, an organic encapsulation layer 402, and a second inorganic encapsulation layer 403 which are stacked in sequence.

In this example, the first inorganic encapsulation layer 401 or/and the second inorganic encapsulation layer 403 extend from the display area 200 to the non-display area 300, and the first inorganic encapsulation layer 401 or/and the second inorganic encapsulation layer 403 lap on a barrier wall structure. The organic encapsulation layer 402 extends to the non-display area 300 and ends at the barrier wall structure.

In this example, the display panel 100 may include at least one barrier wall structure 60. With reference to FIG. 2, the display panel 100 includes a first barrier wall 61 disposed close to the display area 200 of the display panel 100 and a second barrier wall 162 disposed away from the display area 200 of the display panel 100. The first barrier wall 61 may be formed in the same mask process as the planarization layer 118 in the thin film transistor layer. The second barrier wall 62 includes a first portion 621 that may be formed in the same mask process as the planarization layer 118 in the thin film transistor layer 110 and a second portion 622 that may be formed in the same mask process as the pixel defining layer 20 in the display panel 100.

In this example, the organic functional layer 70 may be disposed in the same layer as at least one of the planarization layer 118 and the pixel definition layer 20. With reference to FIG. 2, the organic functional layer 70 may be formed in the same process as the planarization layer 118, that is, after a planarization material layer is coated, it is patterned to form the planarization layer 118 in the display area 200, and to form the organic functional layer 70 in the non-display area 300. The organic functional layer 70 may be continuously disposed around the left and right frames and the top frame of the display panel 100. The bottom frame may not be provided without the organic functional layer 70 due to the presence of the bending region.

In this example, when the display panel 100 is mechanically cut, cracks caused by cutting force may be transmitted to the inside of the display panel 100, while the presence of the organic functional layer 70 may alleviate the stress transmission to some extent.

Figure 6:
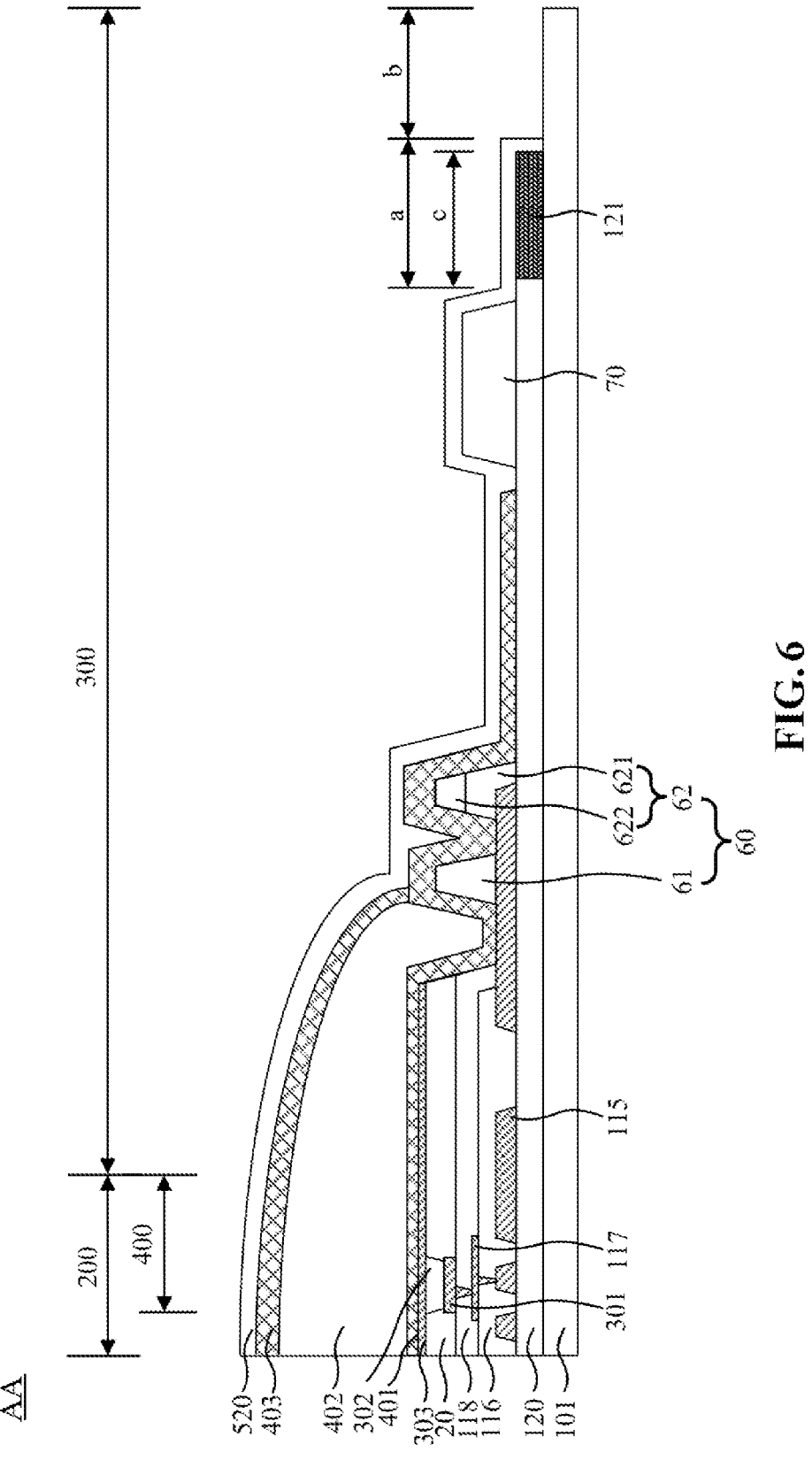
FIG. 6 is a second cross-sectional schematic view of section AA in FIG. 1.

In the display panel 100 of the present disclosure, with reference to FIGS. 2 and 6, the organic functional layer 70 may be disposed separately from the second inorganic encapsulation layer 403 and the first inorganic encapsulation layer 401. Since the side of the organic functional layer 70 away from the display area 200 is a cutting stress concentration area, if the second inorganic encapsulation layer 403 or the first inorganic encapsulation layer 401 laps or crosses the organic functional layer 70, the stress may be transmitted from the second inorganic encapsulation layer 403 or the first inorganic encapsulation layer 401 to the inside of the display panel 100, resulting in inorganic packaging layer packaging failure in the encapsulation layer 40, so the border between the second inorganic encapsulation layer 403 and the first inorganic encapsulation layer 401 cannot exceed the organic functional layer 70. Secondly, since the second inorganic layer 520 is an inorganic film layer with high stress, transmission of cracks and stress is weak, so the second inorganic layer 520 can be lapped on the organic functional layer 70.

In this example, with reference to FIG. 3, the touch layer 50 may include a touch metal layer composed of a first touch metal layer 501 and a second touch metal layer 502, and the touch metal layer may be disposed on one side of the second inorganic layer 520 away from the substrate 101. The touch layer 50 provided by examples of the present disclosure may be mutual capacitance or self capacitance.

In this example, if the touch layer 50 is mutual capacitance, the first touch metal layer 501 may include a plurality of first electrodes and a plurality of second electrodes, wherein the plurality of first electrodes are connected through a first connection bridge located in the first touch metal layer 501, and the plurality of second electrodes are connected through a second connection bridge located in the second touch metal layer 502 passing an insulating layer. If the touch layer 50 is self capacitance, the first touch metal layer 501 may include a plurality of touch electrodes disposed in an array, and the second touch metal layer 502 may include a plurality of touch traces, each of which is correspondingly connected to a touch electrode.

In this example, with reference to FIGS. 2 and 3, taking mutual capacitance touch as an example, the second inorganic layer 520 may be at least one of a first insulating layer 503 disposed between the first touch metal layer 501 and the second touch metal layer 502, a second insulating layer 504 covering the second touch metal layer 502, or an insulating layer disposed between the encapsulation layer 40 and the first touch metal layer 501.

In this example, the internal stress of a film layer of the second inorganic layer 520 may be greater than that of the second inorganic encapsulation layer 403. Since the terrain in border area of the display panel 100 is complicated after the encapsulation layer 40 is formed, the bonding effect of inorganic film layers at the border is poor if the film layer covering the border has low stress, so it is necessary to use an inorganic film layer with high stress to bond the film layers at the border, so as to ensure the bonding effect of inorganic film layers at the border in the complex terrain.

In this example, the internal stress of a film layer of the second inorganic encapsulation layer 403 may be the same as that of the first inorganic layer 120.

In the display panel 100 of the present disclosure, with reference to FIG. 2, the substrate 101, the first inorganic layer 120 and the second inorganic layer 520 are disposed in steps on the side of the organic functional layer 70 away from the display area 200.

In this example, with reference to FIG. 2, an orthographic projection of the first inorganic layer 120 on the substrate 101 is located in the substrate 101, and an orthographic projection of the second inorganic layer 520 on the first inorganic layer 120 is located in the first inorganic layer 120. That is, in the direction of top view of the display panel 100, an area of the second inorganic layer 520 is smaller than that of the first inorganic layer 120, and an area of the first inorganic layer 120 is smaller than that of the substrate 101.

In this example, in the border area of the display panel 100, the substrate 101, the first inorganic layer 120, and the second inorganic layer 520 are disposed in steps, and the stacked shapes of the first inorganic layer 120 and the second inorganic layer 520 may be formed by an etching process. With reference to FIG. 2, the border of the substrate 101 is a cutting border of the display panel 100. In the present disclosure, the plurality of first inorganic layers 120 and the second inorganic layer 520 in the cutting border area are etched by patterning process before cutting, so it only needs to cut the substrate 101 of the flexible display panel 100 during the cutting process, thereby avoiding the technical problem that cracks caused by cutting are transmitted to the display area 200 through the inorganic layer during the mechanical cutting process.

In this example, with reference to FIG. 2, the second inorganic layer 520 covers the organic functional layer 70 and extends towards one side of the organic functional layer 70 away from the display area 200, and the second inorganic layer 520 is in direct contact with an upper surface of the first inorganic layer 120, for example, the second inorganic layer 520 may be in direct contact with an upper surface of the intermediate insulating layer in the array layer 10, and the second inorganic layer 520 extends towards the border of the display panel 100, so that the border of the second inorganic layer 520 with high stress is prevented from being on the organic functional layer 70, thus eliminating the technical problem that the second inorganic layer 520 with high stress is peeled off from the organic functional layer 70 due to stress concentration. Meanwhile, contact between the inorganic film layers increases the adhesion between the second inorganic layer 520 and the first inorganic layer 120, thus avoiding the risk that the second inorganic layer 520 with high stress is peeled from the first inorganic layer 120 due to stress concentration.

In display panels of the present disclosure, the minimum distance between the border of the second inorganic layer 520 and the border of the substrate 101 may be greater than or equal to the minimum distance between the border of the first inorganic layer 120 and the border of the substrate 101. In the structure shown in FIG. 2, the border of the second inorganic layer 520 is located on the first inorganic layer 120, and the minimum distance between the border of the second inorganic layer 520 and the border of the substrate 101 is greater than the minimum distance between the border of the first inorganic layer 120 and the border of the substrate 101.

With reference to FIG. 2, in the direction from the display area 200 to the non-display area 300, a first distance a between the border of the second inorganic layer 520 and the border of the organic functional layer 70 is greater than or equal to 10 microns: a second distance b between the border of the second inorganic layer 520 and the corresponding border of the display panel 100 ranges from 10 microns to 120 microns; and a third distance c between the border of the first inorganic layer 120 and the organic functional layer 70 is greater than or equal to the first distance a.

In this example, the first distance a is greater than or equal to 10 microns, that is, a contact spacing between the second inorganic layer 520 and the first inorganic layer 120 is at least greater than or equal to 10 microns, so as to increase the contact area between the second inorganic layer 520 and the first inorganic layer 120. When the first distance a is less than 10 microns, the contact area between the second inorganic layer 520 and the first inorganic layer 120 is too small, and the problem of stress concentration generated by the second inorganic layer 520 with high stress may result in peeling off of the second inorganic layer 520 and the first inorganic layer 120.

In this example, the second distance b is a thermal buffer region. Since cutting means of the display panel 100 further includes laser cutting, high temperature of the laser will lead to high temperature on both sides of the cutting area. Therefore, a certain thermal buffer region needs to be kept at the border of the display panel 100. If the spacing of the thermal buffer region is too small, high temperature will be transmitted to the organic film layer in the non-display area 300, which will lead to failure of the organic film layer. However, if the spacing of the thermal buffer region is too large, frame spacing of the display panel 100 will be increased, which is not conducive to the design of narrow frames. Therefore, the second distance is disposed to range from 10 microns to 120 microns in the present disclosure.

Figure 4:
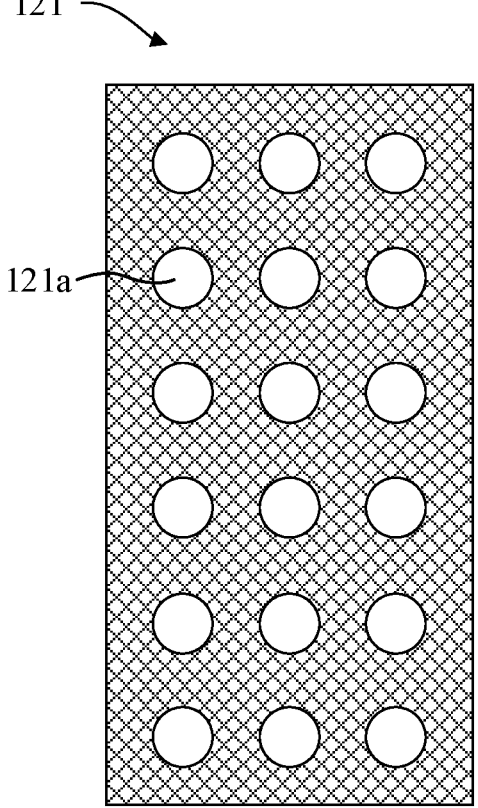
FIG. 4 is first top view of the inorganic extending section in FIG. 1.

In the display panel 100 of the present disclosure, with reference to FIGS. 2 and 4, the plurality of first inorganic layers 120 include an inorganic extending section 121 disposed on one side of the organic functional layer 70 away from the display area 200. The inorganic extending section 121 in FIGS. 2 and 4 is a portion of first inorganic layer 120, which is in contact with a portion of the second inorganic layer 520 close to the border of the display panel 100 and in contact with the first inorganic layer 120.

In this example, with reference to FIG. 4, the inorganic extending section 121 includes a plurality of first openings 121a, and the second inorganic layer 520 may be embedded in the first openings 121a. Two adjacent first openings 121a are disposed separately, and the first openings 121a may be distributed in the inorganic extending section 121 in rows or columns.

In this example, in the direction of top view of the display panel 100, the shape of the first opening 121a may be square, circular, rectangular, or other regular or irregular shapes, for example, the shape of the first opening 121a in FIG. 4 may be square.

In this example, the shapes of two adjacent first openings 121a may be the same or different.

In this example, the border of the substrate 101 is a cutting border of the display panel 100. When the display panel 100 is mechanically cut, cracks generated at the border are mainly transmitted to the central region of the display panel 100 through the plurality of first inorganic layers 120. Therefore, in order to avoid the transmission of cracks, a plurality of first openings 121a are separately disposed in the inorganic extending section 121 in the present disclosure, when cracks are transmitted to the inorganic extending section 121, the first openings 121a can prevent cracks from continuing to extend towards the inside of the display panel 100.

Figure 5:
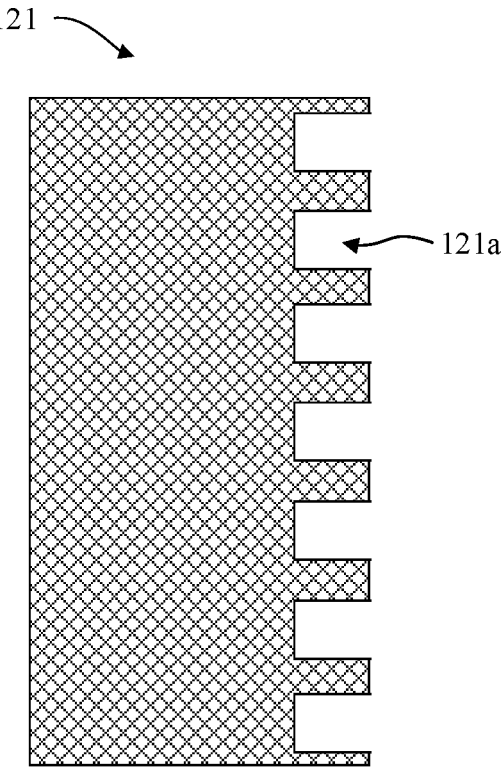
FIG. 5 is second top view of the inorganic extending section in FIG. 1.

In the display panel 100 of the present disclosure, with reference to FIG. 5, at least part of the first openings 121a are located at the border of the inorganic extending section 121 on the side away from the organic functional layer 70. The first openings 121a face towards the border of the display panel 100, and the first openings 121a are disposed so that the border of the inorganic extension 121 is in a zigzag shape.

In the display panel 100 of the present disclosure, with reference to FIG. 6, structure of the display panel 100 this example is the same as or similar to that shown in FIG. 2, and the difference lies in that:

The second inorganic layer 520 covers the first inorganic layer 120, and the second inorganic layer 520 is in direct contact with an upper surface of the substrate 101.

On the basis of FIG. 2, the second inorganic layer 520 in this example continues to extend towards the border of the display panel 100, and the second inorganic layer 520 covers the plurality of first inorganic layers 120. In this example, with reference to FIG. 6, an orthographic projection of the second inorganic layer 520 on the substrate 101 is located in the substrate 101, and an orthographic projection of the first inorganic layer 120 on the second inorganic layer 520 is located in the second inorganic layer 520. That is, in the direction of top view of the display panel 100, an area of the first inorganic layer 120 is smaller than that of the second inorganic layer 520, and an area of the second inorganic layer 520 is smaller than that of the substrate 101.

In this example, with reference to FIG. 6, the second inorganic layer 520 covers the organic functional layer 70 and extends towards one side of the organic functional layer 70 away from the display area 200, and the second inorganic layer 520 covers the first inorganic layer 120 and is in contact with one side of the first inorganic layer 120, while the second inorganic layer 520 is in direct contact with an upper surface of the substrate 101. The second inorganic layer 520 extends towards the border of the display panel 100, so that the border of the second inorganic layer 520 with high stress is prevented from being on the organic functional layer 70, thus eliminating the technical problem that the second inorganic layer 520 with high stress is peeled off from the organic functional layer 70 due to stress concentration. Meanwhile, the second inorganic layer 520 covers the first inorganic layer 120 in all directions, which further increases the contact area between the second inorganic layer 520 and the first inorganic layer 120, and increases the adhesion between the second inorganic layer 520 and the first inorganic layer 120, thus avoiding the risk that the second inorganic layer 520 with high stress is peeled from the first inorganic layer 120 due to stress concentration.

In display panels of the present disclosure, with reference to FIG. 6, the minimum distance between the border of the second inorganic layer 520 and the border of the substrate 101 is smaller than the minimum distance between the border of the first inorganic layer 120 and the border of the substrate 101.

With reference to FIG. 6, in the direction from the display area 200 to the non-display area 300, a first spacing a between the border of the second inorganic layer 520 and the organic functional layer 70 is greater than or equal to 10 microns: a second distance b between the border of the second inorganic layer 520 and the corresponding border of the display panel 100 ranges from 10 microns to 120 microns; and a third distance c between the border of the first inorganic layer 120 and the organic functional layer 70 is smaller than the first distance a.

In this example, the first distance a is greater than or equal to 10 microns, that is, a contact distance between the second inorganic layer 520 and the first inorganic layer 120 is at least greater than or equal to 10 microns, so as to increase the contact area between the second inorganic layer 520 and the first inorganic layer 120. When the first distance a is less than 10 microns, the contact area between the second inorganic layer 520 and the first inorganic layer 120 is too small, and the problem of stress concentration generated by the second inorganic layer 520 with high stress may result in peeling off of the second inorganic layer 520 and the first inorganic layer 120.

In this example, the second distance b is a thermal buffer region. Since cutting means of the display panel 100 further includes laser cutting, high temperature of the laser will lead to high temperature on both sides of the cutting area. Therefore, a certain thermal buffer region needs to be kept at the border of the display panel 100. If the spacing of the thermal buffer region is too small, high temperature will be transmitted to the organic film layer in the non-display area 300, which will lead to failure of the organic film layer. However, if the spacing of the thermal buffer region is too large, frame spacing of the display panel 100 will be increased, which is not conducive to the design of narrow frames. Therefore, the second spacing is disposed to range from 10 microns to 120 microns in the present disclosure.

In this example, there is a small difference between the third distance c and the first distance a, for example, it is only 1 micron. The difference may be only a thickness of the second inorganic layer 520, that is, the maximum contact size between the second inorganic layer 520 and the substrate 101 is 1 micron. When the difference between the third distance c and the first distance a exceeds 1 micron, the second inorganic layer 520 and the substrate 101 may peel off due to stress concentration of the second inorganic layer 520. When the difference between the third distance c and the first distance a is less than 1 micron, it can be considered that a lapping position of the second inorganic layer 520 at the border is the side of the first inorganic layer 120.

In the structure as shown in FIG. 6, when the contact size between the second inorganic layer 520 and the substrate 101 is greater than 1 micron, a plurality of second openings 121b may be disposed in the portion where the second inorganic layer 520 contacts the substrate 101, which is equivalent to reducing the area of the second inorganic layer 520 in the border area, so that the stress in this area can be released. That is, the internal stress of the second inorganic layer 520 in the border area is smaller than that in other areas of the second inorganic layer 520. That is, the technical problem that the second inorganic layer 520 is peeled off from the substrate 101 made of a flexible material due to stress concentration is eliminated.

In this example, for the structure shown in FIG. 6, the corresponding inorganic extending section 121 may be provided with the same first openings 121a as in FIGS. 4 and 5.

Figure 7:
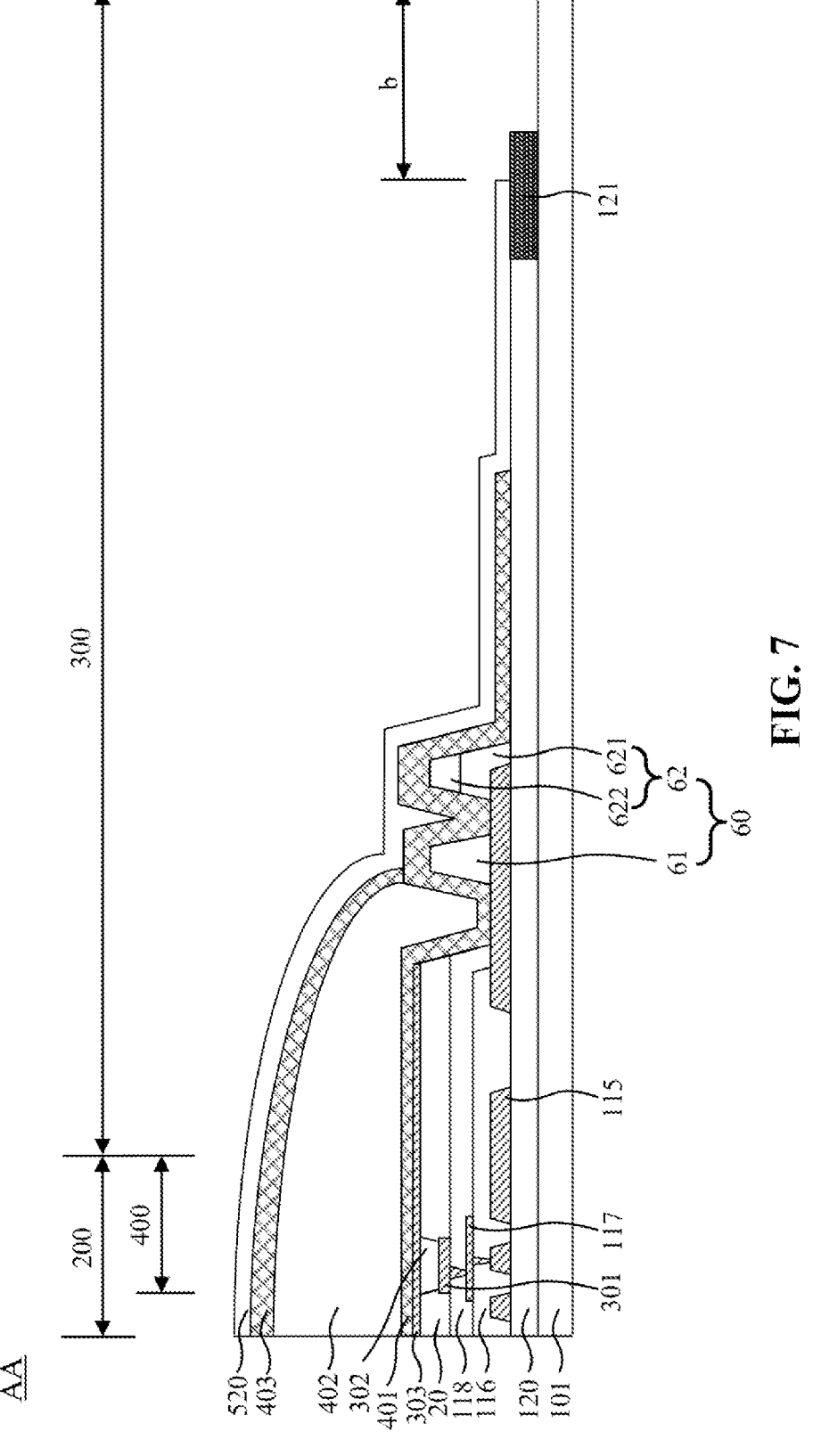
FIG. 7 is a third cross-sectional schematic view of section AA in FIG. 1.

With reference to FIG. 7, the present disclosure provides a display panel 100, which includes a display area 200 and at least one non-display area 300 located on one side of the display area 200. The display area 200 includes a bending sub-area 400 disposed close to the non-display area 300. The display panel 100 further includes:

a substrate 101;
a first inorganic layer 120 disposed on one side of the substrate 101; and there is a distance between the border of the first inorganic layer 120 and the border of the substrate 101;
a light-emitting layer 302 disposed on one side of the first inorganic layer 120 away from the substrate 101, and the light-emitting layer 302 includes a plurality of light-emitting pixels disposed in the display area 200;
an encapsulation layer 40 disposed on one side of the light-emitting layer 302 away from the substrate 101, and the encapsulation layer 40 extends from the display area 200 to the non-display area 300; and
a second inorganic layer 520 disposed on one side of the encapsulation layer 40 away from the substrate 101, and the second inorganic layer 520 extends from the display area 200 to the non-display area 300, and is in contact with at least part surface of the first inorganic layer located at a border of the organic functional layer and a border of the substrate.

In this example, the distance between the border of the second inorganic layer 520 and the border of the substrate 101 may be a second distance b, which may range from 10 microns to 120 microns.

In this example, since the border of the substrate 101 is a cutting border of the display panel 100, while the plurality of first inorganic layers 120 and the second inorganic layer 520 in the cutting border area are etched by patterning process before cutting in the present disclosure, so it only needs to cut the substrate 101 of the flexible display panel 100 during the cutting process, thereby avoiding the technical problem that cracks caused by cutting are transmitted to the display area 200 through the inorganic layer during the mechanical cutting process. In addition, since the organic functional layer 70 is mainly used to block the transmission of cutting cracks, and the inorganic film layer is removed in the cutting process in this example, that is, there may be a less transmission of the cutting stress, so the organic functional layer 70 in the in this example may be removed.

In this example, with reference to FIG. 7, the first inorganic layer 120 includes an inorganic extending section 121 disposed close to the border of the substrate 101 and disposed in the non-display area 300. The inorganic extending section 121 includes a plurality of first openings 121a disposed at intervals. The second inorganic layer 520 covers at least part of the first openings 121a.

In this example, the border of the substrate 101 is a cutting border of the display panel 100. Although the first inorganic layer 120 in the cutting border is removed, it is unavoidable that cracks transmitting to the inside will be generated. Therefore, in order to avoid the transmission of cracks, a plurality of first openings 121a disposed at intervals in the inorganic extending section 121 in the present disclosure. When the cracks are transmitted to the inorganic extending section 121, the first openings 121a can prevent cracks from continuing to extend towards the inside of the display panel 100.

The structure of the display panel 100 this example is the same as or similar to that shown in FIG. 2.

The present disclosure further provides a mobile terminal including a terminal body and the above display panel, wherein the terminal main body and the display panel are combined into a whole. The terminal body may be a device such as a circuit board bound to the display panel and a cover plate covering the display panel. The mobile terminal may include an electronic device such as a mobile phone, a television, a notebook computer, or the like.

It can be understood that, equivalent replacements or changes can be made according to the technical solutions and inventive concepts of the present disclosure for a person skilled in the art, and all these changes or replacements should fall within the protection scope of the claims appended to the present disclosure.

The invention claimed is:

1. A display panel, comprising a display area and at least one non-display area located on one side of the display area, wherein the display panel further comprises:
   a substrate;
   at least one first inorganic layer disposed on one side of the substrate;
   an organic functional layer disposed on one side of the first inorganic layer away from the substrate and in the non-display area;
   a light-emitting layer disposed at one side of the first inorganic layer away from the substrate, and comprising a plurality of light-emitting pixels disposed in the display area;
   an encapsulation layer disposed on one side of the light-emitting layer away from the substrate, and extending from the display area to the non-display area; and
   a second inorganic layer disposed on one side of the encapsulation layer away from the substrate, extending from the display area to the non-display area, and covering at least part of the organic functional layer, wherein the second inorganic layer is in contact with at least part surface of the first inorganic layer located at a border of the organic functional layer and a border of the substrate;
   wherein a minimum distance between a border of the second inorganic layer and the border of the substrate is greater than or equal to a minimum distance between a border of the first inorganic layer and the border of the substrate.

2. The display panel according to claim 1, wherein the first inorganic layer comprises an inorganic extending section disposed on one side of the organic functional layer away from the display area, the inorganic extending section comprises a plurality of first openings disposed at intervals, and the second inorganic layer covers at least part of the first openings.

3. The display panel according to claim 1, wherein in a direction from the display area to the non-display area, a distance between the border of the second inorganic layer and the border of the organic functional layer is greater than or equal to 10 microns, and a distance between the border of the second inorganic layer and a corresponding border of the display panel ranges from 10 microns to 120 microns.

4. The display panel according to claim 1, wherein the display area comprises a bending sub-area disposed close to the non-display area, and
   internal stress of a film layer of the second inorganic layer is greater than that of the first inorganic layer.

5. The display panel according to claim 4, wherein the internal stress of a film layer of the second inorganic layer is greater than or equal to −400 MPa and less than or equal to −80 MPa.

6. The display panel according to claim 4, wherein the encapsulation layer comprises a first inorganic encapsulation layer, an organic encapsulation layer, and a second inorganic encapsulation layer that are stacked in sequence, and the internal stress of a film layer of the second inorganic layer is greater than that of the second inorganic encapsulation layer.

7. The display panel according to claim 1, wherein the display panel further comprises:
   a touch metal layer disposed on one side of the second inorganic layer away from the substrate.

8. A mobile terminal, wherein the mobile terminal comprises a terminal body and the display panel according to claim 1, and the terminal body and the display panel are combined into a whole.

9. A display panel, comprising a display area and at least one non-display area located on one side of the display area, wherein the display panel further comprises:
   a substrate;
   at least one first inorganic layer disposed on one side of the substrate, wherein a spacing exists between a border of the first inorganic layer and a border of the substrate;
   a light-emitting layer disposed at one side of the first inorganic layer away from the substrate, and comprising a plurality of light-emitting pixels disposed in the display area;
   an encapsulation layer disposed on one side of the light-emitting layer away from the substrate, and extending from the display area to the non-display area; and
   a second inorganic layer disposed on one side of the encapsulation layer away from the substrate, and extending from the display area to the non-display area, wherein the second inorganic layer is in contact with at least part surface of the first inorganic layer located at a border of an organic functional layer and a border of the substrate;
   wherein a minimum distance between a border of the second inorganic layer and the border of the substrate is greater than or equal to a minimum distance between a border of the first inorganic layer and the border of the substrate.

10. The display module according to claim 9, wherein the first inorganic layer comprises an inorganic extending section disposed on one side of the organic functional layer away from the display area, the inorganic extending section comprises a plurality of first openings disposed at intervals, and the second inorganic layer covers at least part of the first openings.

11. The display panel according to claim 9, wherein display area comprises a bending sub-area disposed close to the non-display area, and
   internal stress of a film layer of the second inorganic layer is greater than that of the first inorganic layer.

12. The display panel according to claim 11, wherein internal stress of a film layer of the second inorganic layer is greater than or equal to −400 MPa and less than or equal to −80 MPa.

13. The display panel according to claim 11, wherein the encapsulation layer comprises a first inorganic encapsulation layer, an organic encapsulation layer, and a second inorganic encapsulation layer that are stacked in sequence, and the internal stress of a film layer of the second inorganic layer is greater than that of the second inorganic encapsulation layer.

14. The display panel according to claim 9, wherein the display panel further comprises:

a touch metal layer disposed on one side of the second inorganic layer away from the substrate.

15. A display panel, comprising a display area and at least one non-display area located on one side of the display area, wherein the display panel further comprises:

a substrate;

at least one first inorganic layer disposed on one side of the substrate;

an organic functional layer disposed on one side of the first inorganic layer away from the substrate and in the non-display area;

a light-emitting layer disposed at one side of the first inorganic layer away from the substrate, and comprising a plurality of light-emitting pixels disposed in the display area;

an encapsulation layer disposed on one side of the light-emitting layer away from the substrate, and extending from the display area to the non-display area; and a second inorganic layer disposed on one side of the encapsulation layer away from the substrate, extending from the display area to the non-display area, and covering at least part of the organic functional layer, wherein the second inorganic layer is in contact with at least part surface of the first inorganic layer located at a border of the organic functional layer and a border of the substrate;

wherein a minimum distance between a border of the second inorganic layer and the border of the substrate is smaller than a minimum distance between a border of the first inorganic layer and the border of the substrate.

16. The display panel according to claim 15, wherein the second inorganic layer is further in direct contact with an upper surface of the substrate.

17. The display panel according to claim 15, wherein the display area comprises a bending sub-area disposed close to the non-display area, and internal stress of a film layer of the second inorganic layer is greater than that of the first inorganic layer.

18. The display panel according to claim 17, wherein the internal stress of a film layer of the second inorganic layer is greater than or equal to −400 MPa and less than or equal to −80 MPa.

19. The display panel according to claim 17, wherein the encapsulation layer comprises a first inorganic encapsulation layer, an organic encapsulation layer, and a second inorganic encapsulation layer that are stacked in sequence, and the internal stress of a film layer of the second inorganic layer is greater than that of the second inorganic encapsulation layer.

20. The display panel according to claim 15, wherein the display panel further comprises:

a touch metal layer disposed on one side of the second inorganic layer away from the substrate.

* * * * *